(12) United States Patent
Takeuchi

(10) Patent No.: US 12,531,558 B2
(45) Date of Patent: Jan. 20, 2026

(54) CMOS CIRCUIT

(71) Applicant: Japan Aerospace Exploration Agency, Chofu (JP)

(72) Inventor: Kozo Takeuchi, Chofu (JP)

(73) Assignee: Japan Aerospace Exploration Agency (JP)

( * ) Notice: Subject to any disclaimer, the term of this patent is extended or adjusted under 35 U.S.C. 154(b) by 142 days.

(21) Appl. No.: 18/555,494

(22) PCT Filed: May 11, 2022

(86) PCT No.: PCT/JP2022/019955
§ 371 (c)(1),
(2) Date: Oct. 13, 2023

(87) PCT Pub. No.: WO2022/244664
PCT Pub. Date: Nov. 24, 2022

(65) Prior Publication Data
US 2024/0213983 A1    Jun. 27, 2024

(30) Foreign Application Priority Data
May 19, 2021 (JP) .................................. 2021-084623

(51) Int. Cl.
*H03K 19/003* (2006.01)

(52) U.S. Cl.
CPC .............................. *H03K 19/00315* (2013.01)

(58) Field of Classification Search
CPC ....... H03K 19/00315; H03K 19/00338; H10D 84/859
See application file for complete search history.

(56) References Cited

U.S. PATENT DOCUMENTS 9,490,249 B2 * 11/2016 Lue ....................... H01L 23/552
2001/0006352 A1 * 7/2001 Toyoyama ......... H03K 19/0016
327/534

(Continued)

FOREIGN PATENT DOCUMENTS

JP           08251012 A  *  9/1996
JP      2004-048170 A       2/2004

(Continued)

OTHER PUBLICATIONS

International Search Report mailed Aug. 9, 2022 in corresponding PCT International Application No. PCT/JP2022/019955.

(Continued)

*Primary Examiner* — Seokjin Kim
(74) *Attorney, Agent, or Firm* — OSTROLENK FABER LLP

(57) ABSTRACT

A complementary metal oxide semiconductor (CMOS) circuit includes a logical operation circuit formed on a substrate of a first conductivity type and including at least a combination of a first transistor of the first conductivity type having a first well of a second conductivity type different from the first conductivity type and a second transistor of the second conductivity type having a second well of the first conductivity type, a third transistor of the first conductivity type having a gate terminal connected to the second well, and a fourth transistor of the second conductivity type having a gate terminal connected to the first well.

6 Claims, 11 Drawing Sheets

(56) References Cited

U.S. PATENT DOCUMENTS

| | | | |
|---|---|---|---|
| 2007/0069305 A1 | 3/2007 | Kuboyama et al. | |
| 2007/0162880 A1 | 7/2007 | Carlson et al. | |
| 2021/0242678 A1* | 8/2021 | Ille | H02H 9/046 |
| 2023/0253265 A1* | 8/2023 | Takeuchi | H10D 84/038 |
| | | | 257/371 |

FOREIGN PATENT DOCUMENTS

| | | | | |
|---|---|---|---|---|
| JP | 2007-189191 A | 7/2007 | | |
| JP | 2013-201770 A | 10/2013 | | |
| JP | 2022178087 A | * 12/2022 | ....... | H03K 19/00315 |
| WO | WO 2005/076479 A1 | 8/2005 | | |
| WO | WO 2022/030596 A1 | 2/2022 | | |

OTHER PUBLICATIONS

S.Mitra et al., "Robust system design with built-in soft-error resilience", IEEE Computer Society, vol. 38, No. 2, pp. 43-52, Feb. 2005, doi: 10.1109/MC. 2005.70.

* cited by examiner

CMOS CIRCUIT

CROSS-REFERENCE TO RELATED APPLICATIONS

The present application is a 35 U.S.C. §§ 371 national stage application of International Application No. PCT/JP2022/019955, filed May 11, 2022, which claims priority to Japanese Patent Application No. 2021-084623, filed May 19, 2021, the contents of which are incorporated herein by reference.

TECHNICAL FIELD

The present invention relates to a complementary metal oxide semiconductor (CMOS) circuit.

Priority is claimed on Japanese Patent Application No. 2021-084623, filed May 19, 2021, the content of which is incorporated herein by reference.

BACKGROUND ART

In the related art, for example, semiconductor integrated circuits such as a CMOS-type large scale integration (LSI) circuit, an application specific integrated circuit (ASIC), a field-programmable gate array (FPGA), and a graphics processing unit (GPU) are used in various types of equipment and devices. In a CMOS-type semiconductor integrated circuit, a circuit is formed by connecting a plurality of circuit elements such as transistors formed on a semiconductor substrate (for example, a silicon substrate) to implement a function of performing necessary operations.

For example, CMOS-type semiconductor integrated circuits for use in outer space, such as satellites orbiting the earth, are used in environments where radiation such as high-energy charged particles is incident. Furthermore, it is known that CMOS-type semiconductor integrated circuits for terrestrial use are also affected by radiation such as neutrons. Radiation incident on a CMOS-type semiconductor integrated circuit is known to cause malfunctions of circuit elements formed on a semiconductor substrate. More specifically, it is known that, when high-energy charged particles are incident on a CMOS-type semiconductor integrated circuit, for example, potential fluctuations (so-called single event transient: SET), erroneous data storage (so-called single event upset: SEU) due to the propagation of signals affected by the potential fluctuations, and the like, occur.

In the related art, various technologies for taking countermeasures against single events such as single event transients and single event upsets have been disclosed (see Patent Document 1 and Non-Patent Document 1). For example, Patent Document 1 discloses that a single event malfunction caused by high-energy charged particles is prevented from propagating to a subsequent stage by forming circuit elements in a double structure (vertical lamination structure). For example, Non-Patent Document 1 discloses technology related to the design (structure) of an embedded circuit element with enhanced resistance (robustness) to single event errors (soft errors).

CITATION LIST

Patent Literature

[Patent Document 1]

Japanese Unexamined Patent Application, First Publication No. 2004-048170

Non-Patent Document

[Non-Patent Document 1]
S. Mitra, N. Seifert, M. Zhang, Q. Shi, K. S. Kim, "Robust system design with built-in soft-error resilience," IEEE Computer Society, vol. 38, no. 2, pp. 43-52, February 2005, doi: 10.1109/MC. 2005.70.

SUMMARY OF INVENTION

Technical Problem

However, technology disclosed in Patent Document 1 is effective only when circuit elements are formed on a semiconductor substrate having a silicon on insulator (SOI) structure. The semiconductor substrate having the SOI structure has a structure in which an insulating layer is provided inside of the substrate and therefore is more expensive than, for example, a silicon single crystal substrate (a so-called bulk substrate). Furthermore, in recent years, the microfabrication of a process of manufacturing CMOS-type semiconductor integrated circuits has progressed. Thus, circuit elements to which the conventional technology is applied cannot be expected to have the effect of countermeasures against a single event with the microfabrication of the manufacturing process. This is because countermeasures against single events are taken by providing a spatial distance between components constituting the circuit element in the conventional technology, but circuit elements formed on the semiconductor substrate become smaller when the microfabrication of the manufacturing process is performed, it is difficult to ensure the necessary distance between the components, and the effect of countermeasures against single events based on the conventional technology is nullified.

The present invention has been made based on the recognition of the above problem and an objective of the present invention is to provide a CMOS circuit having high resistance to a single event.

Solution to Problem

According to an aspect of the present invention for achieving the aforementioned objective, there is provided a complementary metal oxide semiconductor (CMOS) circuit including: a logical operation circuit formed on a substrate of a first conductivity type and including at least a combination of a first transistor of the first conductivity type having a first well of a second conductivity type different from the first conductivity type and a second transistor of the second conductivity type having a second well of the first conductivity type: a third transistor of the first conductivity type having a gate terminal connected to the second well; and a fourth transistor of the second conductivity type having a gate terminal connected to the first well.

Advantageous Effects of Invention

According to an aspect of the present invention, it is possible to increase the resistance to a single event in a CMOS circuit.

DESCRIPTION OF EMBODIMENTS

Embodiments of a complementary metal oxide semiconductor (CMOS) circuit of the present invention will be described below with reference to the drawings. As used throughout this disclosure, when this application is translated from Japanese to English, the singular forms "a," "an," and "the" may include a plurality of references unless the context clearly dictates otherwise. The CMOS circuit of the embodiment is, for example, a single logical operation circuit that performs logical operations such as a logical negation circuit (a NOT circuit or an inverter circuit), a logical sum circuit (an OR circuit), a logical product circuit (an AND circuit), a negative logical sum circuit (a NOR circuit), a negative logical product circuit (a NAND circuit), an exclusive logical sum circuit (an EXOR circuit), or a negative exclusive logical sum circuit (an EXNOR circuit). The CMOS circuit of the embodiment can also be configured to transmit data (a signal level) of a buffer circuit, a transmission gate circuit, or the like or to hold data (a signal level) of a latch circuit, a flip-flop circuit, or the like, by combining a plurality of single logical operation circuits. Furthermore, the CMOS circuit of the embodiment can also be configured to store (memorize) data (a signal level), for example, as in a static random access memory (SRAM) or the like, by combining a plurality of single logical operation circuits, flip-flop circuits, transmission gate circuits, and the like.

First Embodiment

In the following description, for ease of description, a logical negation circuit (hereinafter referred to as an "inverter circuit"), which is a logical operation circuit with the simplest configuration, will be described as an example of the CMOS circuit of the first embodiment.

[Configuration of Inverter Circuit]

Figure 1:
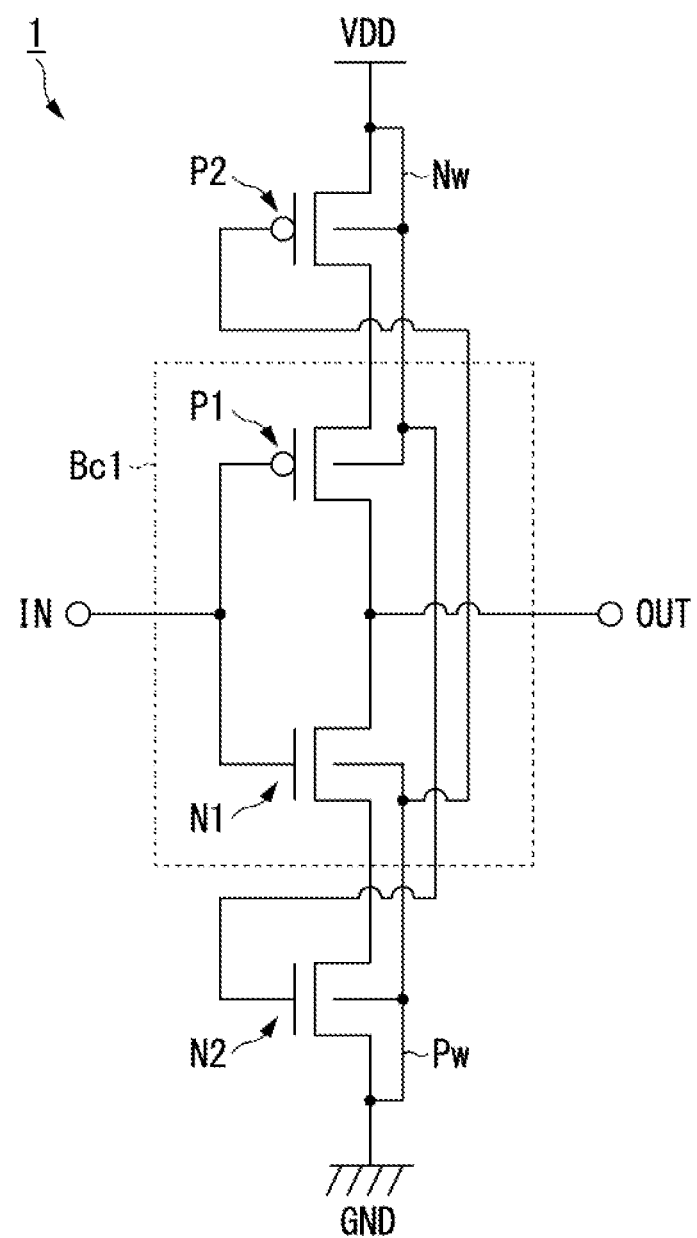
FIG. 1 is a diagram showing an example of a configuration of a CMOS circuit according to a first embodiment.

FIG. 1 is a diagram showing an example of a configuration of a CMOS circuit (an inverter circuit) according to the first embodiment. An inverter circuit 1 includes a P-channel MOS transistor P1, an N-channel MOS transistor N1, a P-channel MOS transistor P2, and an N-channel MOS transistor N2. The inverter circuit 1 shown in FIG. 1 is an example in which each transistor is formed on a P-type single crystal semiconductor substrate (bulk substrate).

In the inverter circuit 1, a configuration of the P-channel MOS transistor P1 and the N-channel MOS transistor N1 is a configuration of a basic logical negation circuit (an inverter circuit) in a general logical operation circuit. In the following description, an inverter circuit having a basic configuration based on the P-channel MOS transistor P1 and the N-channel MOS transistor N1 is referred to as a "basic NOT circuit Bc1" and is distinguished from the inverter circuit 1 of the first embodiment.

The P-channel MOS transistor P1 has a gate terminal connected to the input terminal IN of the inverter circuit 1, a source terminal connected to a drain terminal of the P-channel MOS transistor P2, and a drain terminal connected to a drain terminal of the N-channel MOS transistor N1. The N-channel MOS transistor N1 has a gate terminal connected to the input terminal IN of the inverter circuit 1, a source terminal connected to a drain terminal of the N-channel MOS transistor N2, and a drain terminal connected to a drain terminal of the P-channel MOS transistor P1. A node to which the drain terminal of the P-channel MOS transistor P1 and the drain terminal of the N-channel MOS transistor N1 are connected serves as an output terminal OUT of the inverter circuit 1.

In the inverter circuit 1, the P-channel MOS transistor P2 is arranged on the source terminal side of the P-channel MOS transistor P1 and has a source terminal connected to a power supply VDD (a potential fixed to the power supply) and a drain terminal connected to a source terminal of the P-channel MOS transistor P1. A gate terminal of the P-channel MOS transistor P2 is connected to a P-well Pw of the N-channel MOS transistor N1 (a body of the N-channel MOS transistor N1 in FIG. 1). The N-channel MOS transistor N2 is arranged on the source terminal side of the N-channel MOS transistor N1 and has a source terminal connected to a ground GND (a potential fixed to the ground) and the drain terminal connected to a source terminal of the N-channel MOS transistor N1. The gate terminal of the N-channel MOS transistor N2 is connected to an N-well Nw of the P-channel MOS transistor P1 (a body of the P-channel MOS transistor P1 in FIG. 1). The gate terminals of the P-channel MOS transistor P2 and the N-channel MOS transistor N2 and wells corresponding thereto may be connected through, for example, well contacts and the like.

In the inverter circuit 1, a configuration of the P-channel MOS transistor P2 and the N-channel MOS transistor N2 may be referred to as a power-supply circuit for the basic NOT circuit Bc1. In the following description, a configuration of the P-channel MOS transistor P2 and the N-channel MOS transistor N2 is also referred to as a "power-supply circuit."

A P-type single crystal semiconductor substrate is an example of a "substrate of a first conductivity type" in the claims. The P-channel MOS transistor P1 is an example of a "first transistor" in the claims and the N-channel MOS transistor N1 is an example of a "second transistor" in the claims. The N-well Nw is an example of a "first well" in the claims and the P-well Pw is an example of a "second well" in the claims. A P-type or a P-channel is an example of the "first conductivity type" in the claims and an N-type or an N-channel is an example of a "second conductivity type" in the claims. A basic NOT circuit Bc1 is an example of a "logical operation circuit" in the claims. The P-channel MOS transistor P2 is an example of a "third transistor" in the claims and the N-channel MOS transistor N2 is an example of a "fourth transistor" in the claims.

[Operation of Inverter Circuit]

Figure 2:
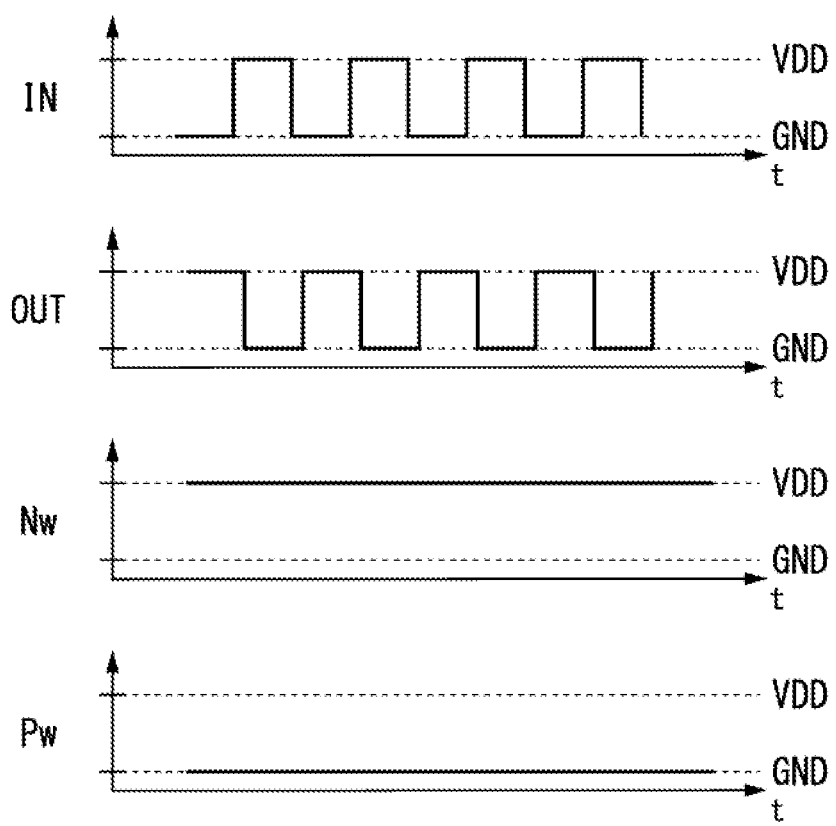
FIG. 2 is a timing chart showing an example of a normal operation in the CMOS circuit according to the first embodiment.

An operation timing of the inverter circuit 1 will now be described. First, a normal operation of the inverter circuit 1 will be described. FIG. 2 is a timing chart showing an example of the normal operation in the CMOS circuit (the inverter circuit 1) according to the first embodiment. FIG. 2 is a timing chart of a normal state in which no high-energy charged particles of radiation are incident on the inverter circuit 1. In the following description, a "High" level of each signal in the inverter circuit 1 is assumed to be a level of the power supply VDD (hereinafter referred to as a "VDD level") and a "Low" level is assumed to be a level of the ground GND (hereinafter referred to as a "GND level").

In FIG. 2, a timing at which a signal of each of the input terminal IN, the output terminal OUT, the N-well Nw, and the P-well Pw changes and its signal level in the case where an input signal has been input to the input terminal IN of the inverter circuit 1 with the signal level changed between the VDD level and the GND level at prescribed time intervals are shown.

In a normal operation of the inverter circuit 1, the N-well Nw is at the VDD level and the P-well Pw is at the GND level. That is, the power-supply circuit including the P-channel MOS transistor P2 and the N-channel MOS transistor N2 provided in the inverter circuit 1 is turned on all the time. Thus, in the normal operation of the inverter circuit 1, an input signal input to the input terminal IN is inverted at a timing delayed by a prescribed delay time in the basic NOT circuit Bc1 and the inverted input signal is output to the output terminal OUT.

Thus, in the normal operation of the inverter circuit 1, the internal signal output by the basic NOT circuit Bc1 is output as an output signal to the output terminal OUT. In other words, in the normal operation of the inverter circuit 1, the input signal input to the input terminal IN of the inverter circuit 1 is inverted and the inverted input signal is output to the output terminal OUT as in a general logical negation circuit.

Figure 3:
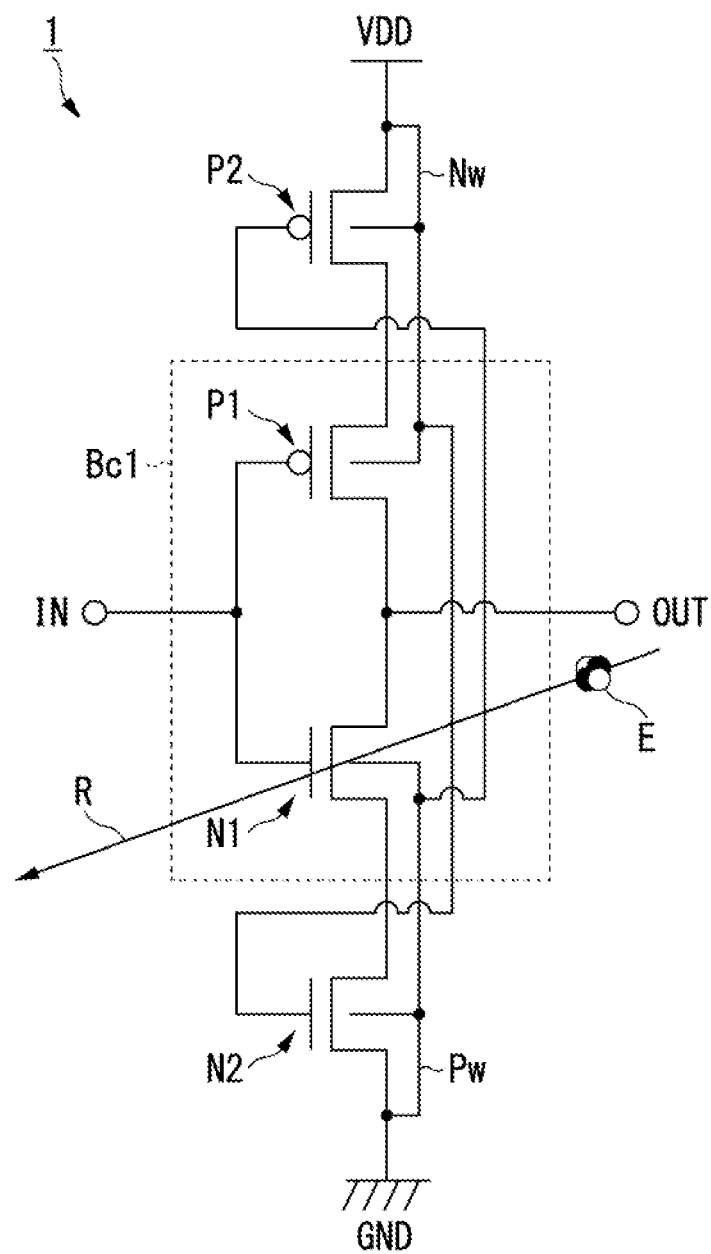
FIG. 3 is a diagram schematically showing an example of a state in which high-energy charged particles are incident on the CMOS circuit according to the first embodiment.

Next, an operation when high-energy charged particles of radiation are incident on the inverter circuit 1 will be described. FIG. 3 is a diagram schematically showing an example of a state in which high-energy charged particles are incident on the CMOS circuit (the inverter circuit 1) according to the first embodiment. In FIG. 3, a case where high-energy charged particles E of radiation R are incident on the N-channel MOS transistor N1 of the basic NOT circuit Bc1 constituting the inverter circuit 1 is shown. Due to the incident charged particles E, a single event transient corresponding to the charge of the incident charged particles E also occurs in the inverter circuit 1. It is known that the incident charged particles E have a greater influence on a transistor in the OFF state than on a transistor in the ON state.

Figure 4:
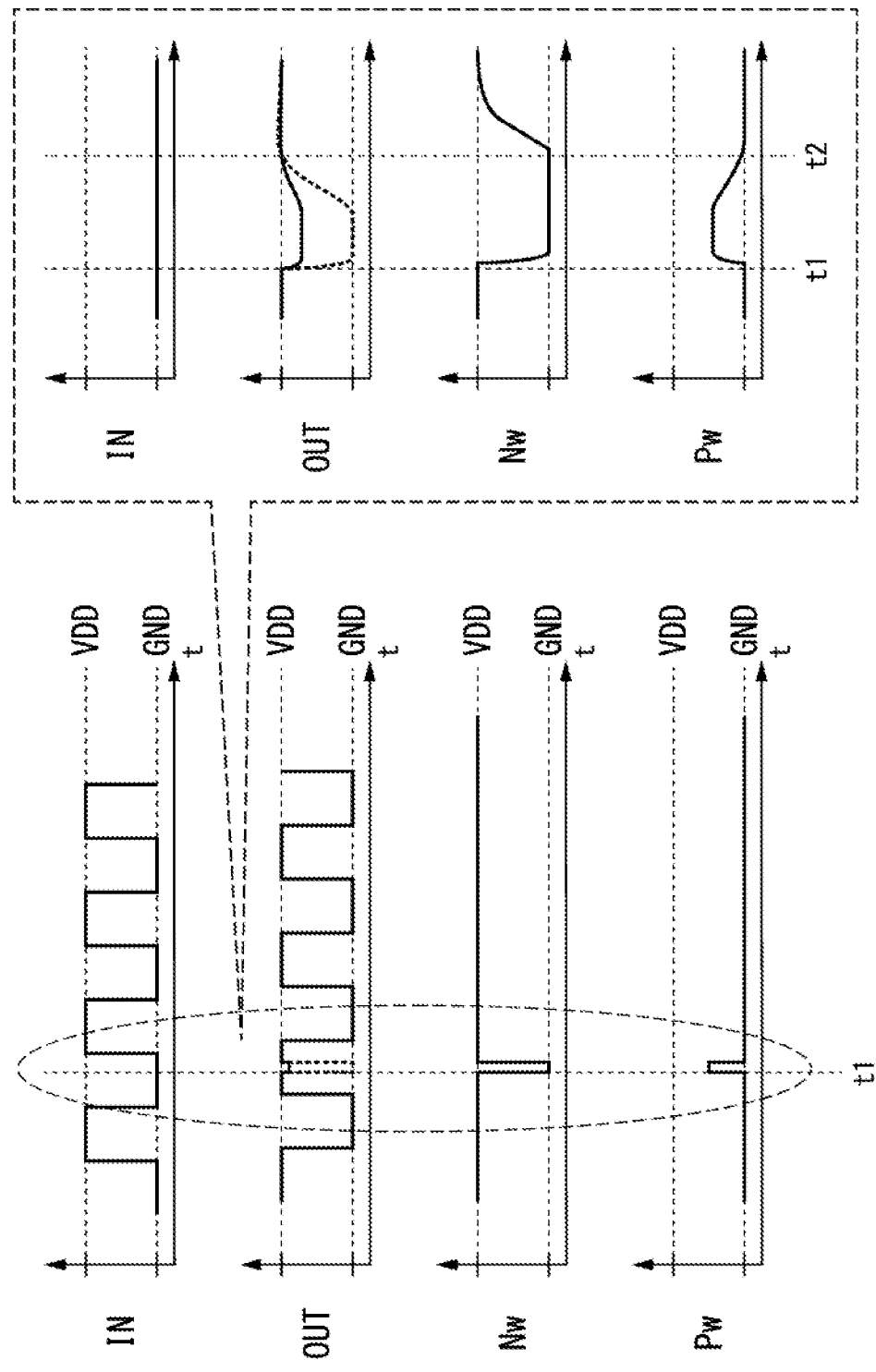
FIG. 4 is a timing chart showing an example of an operation when a single event has occurred due to high-energy charged particles incident on the CMOS circuit according to the first embodiment.

FIG. 4 is a timing chart showing an example of an operation when a single event has occurred due to high-energy charged particles incident on the CMOS circuit (the inverter circuit 1) according to the first embodiment. FIG. 4 is a timing chart of a case where charged particles E are incident when an input signal of the GND level is being input to the input terminal IN of the inverter circuit 1.

If the charged particles E are incident on the N-channel MOS transistor N1 of the basic NOT circuit Bc1 at timing t1 when an input signal of the GND level is input to the input terminal IN of the inverter circuit 1, the potential of the N-channel MOS transistor N1 in the OFF state transiently fluctuates in accordance with the charge of the incident charged particles E. Thereby, an instantaneous pulse of the GND level appears at the output node of the basic NOT circuit Bc1, i.e., at the output terminal OUT, as indicated by the dashed line in FIG. 4. This is a single event transient.

On the right side of FIG. 4, a period in which the single event transient occurs is enlarged to show the more detailed timing and its signal level. With the occurrence of the single event transient, for example, the potential level of the N-well Nw decreases and the potential level of the P-well Pw increases. On the right side of FIG. 4, an example in which the potential level of the N-well Nw drops to the GND level and the potential level of the P-well Pw rises to a level between the VDD level and the GND level is shown. A difference in the amount of change in the potential level in each well shown on the right side of FIG. 4 is an example based on the assumption that the potential level of the N-well Nw changes more greatly than that of the P-well Pw because the semiconductor substrate that forms the CMOS circuit is a P-type single crystal semiconductor substrate and the amount of change in the potential level in each well is considered to change, for example, in accordance with the charge of the charged particles E.

Thereupon, the N-channel MOS transistor N2 is turned off as the potential level of the N-well Nw is lowered and the P-channel MOS transistor P2 is turned off as the potential level of the P-well Pw is raised. That is, the power-supply circuit is turned off. On the right side of FIG. 4, the power-supply circuit is turned off from timing t1 to timing t2. Thereby, the N-channel MOS transistor N2 is not affected by the potential levels of the P-well Pw and the N-well Nw that fluctuate due to the charge of the incident charged particles E and the basic NOT circuit Bc1 is prevented from outputting a signal including a single event transient to the output node (the output terminal OUT). In other words, when the power-supply circuit is turned off in the inverter circuit 1, the influence of the change in the well potential level due to the charge of the incident charged particles E is eliminated or the single event transient included in the signal output to the output node by the basic NOT circuit Bc1 is reduced. In FIG. 4, an example in which the single event transient is reduced and output to the output terminal OUT is indicated by a solid line.

Figure 5:
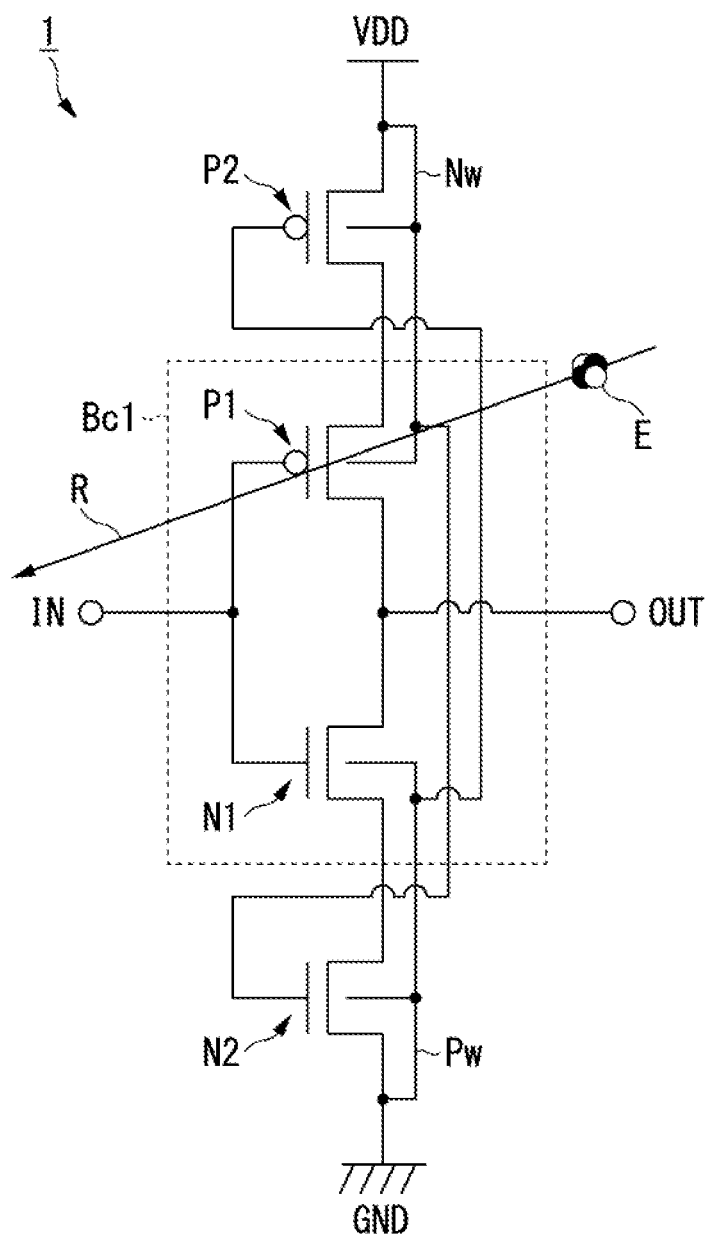
FIG. 5 is a diagram schematically showing another example of a state in which high-energy charged particles are incident on the CMOS circuit according to the first embodiment.

FIG. 5 is a diagram schematically showing another example of a state in which high-energy charged particles are incident on the CMOS circuit (the inverter circuit 1) according to the first embodiment. In FIG. 5, a case where high-energy charged particles E of radiation R are incident on the P-channel MOS transistor P1 of the basic NOT circuit Bc1 constituting the inverter circuit 1 is shown.

Figure 6:
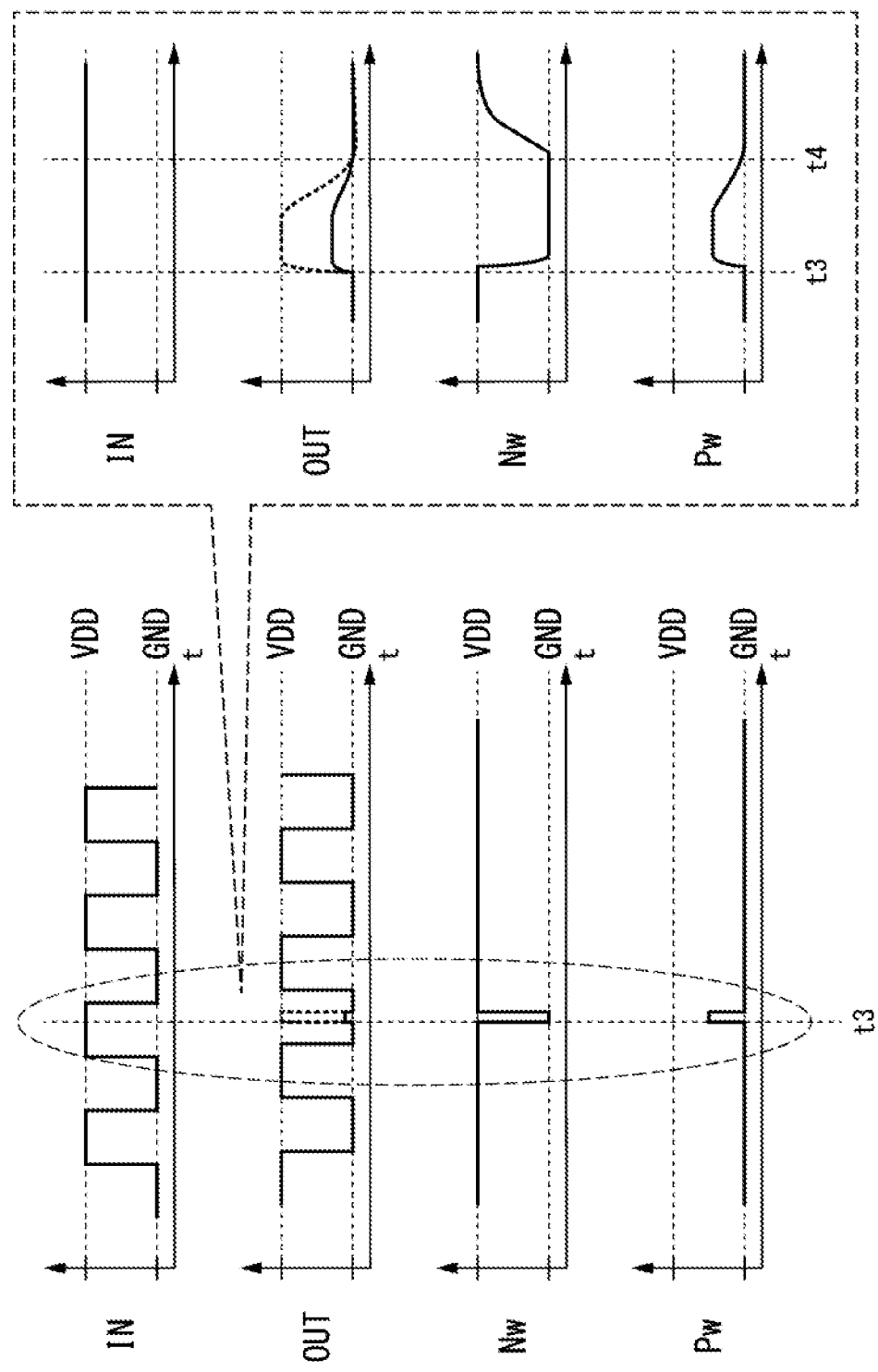
FIG. 6 is a timing chart showing another example of an operation when a single event has occurred due to high-energy charged particles incident on the CMOS circuit according to the first embodiment.

FIG. 6 is a timing chart showing another example of an operation when a single event has occurred due to high-energy charged particles incident on the CMOS circuit (the inverter circuit 1) according to the first embodiment. FIG. 6 is a timing chart of a case where charged particles E are incident while an input signal of the VDD level is being input to the input terminal IN of the inverter circuit 1.

When the charged particles E are incident on the P-channel MOS transistor P1 of the basic NOT circuit Bc1 at timing t3 when the input signal of the VDD level is input to the input terminal IN of the inverter circuit 1, the potential of the P-channel MOS transistor P1 in the OFF state fluctuates and an instantaneous pulse of the VDD level as indicated by the dashed line in FIG. 6 appears as a single event transient.

More detailed timings and signal levels thereof obtained by enlarging the period in which the single event transient occurs are also shown on the right side of FIG. 6. The power-supply circuit is turned off as in the case where the charged particles E are incident on the N-channel MOS transistor N1 when the input signal of the GND level is input to the input terminal IN of the inverter circuit 1 shown in FIG. 4 along with the occurrence of the single event transient. On the right side of FIG. 6, the power-supply circuit is turned off from timing t3 to timing t4. Thereby, the P-channel MOS transistor P1 is not affected by the potential levels of the P-well Pw and the N-well Nw that fluctuate due to the charge of the incident charged particles E and the basic NOT circuit Bc1 is prevented from outputting a signal including a single event transient to the output node (the output terminal OUT). In FIG. 6, a solid line indicates an example in which a single event transient is reduced and a signal including the reduced single event transient is output to the output terminal OUT.

Thus, in the inverter circuit 1, each of the P-channel MOS transistor P2 and the N-channel MOS transistor N2 connected as the power-supply circuit of the basic NOT circuit Bc1 due to the incident charged particles E is turned off according to fluctuations in the potential level of the well. Thereby, in the inverter circuit 1, a signal including a single event transient occurring in any one transistor in the OFF state provided in the basic NOT circuit Bc1 is prevented from being output to the output node (the output terminal OUT). In other words, in the inverter circuit 1, the single event transient output to the output terminal OUT is eliminated or reduced by the power-supply circuit that is turned off according to the incident charged particles E. Thereby, in the inverter circuit 1, a single event transient occurring inside of the inverter circuit 1 is prevented from propagating to, for example, another CMOS circuit connected to a stage subsequent to the inverter circuit 1. Thereby, in a CMOS semiconductor integrated circuit including the inverter circuit 1, it is possible to prevent a single event upset in which erroneous data is stored due to propagation of a signal including a single event transient that has occurred. In other words, it is possible to increase the resistance to a single event occurring when charged particles E are incident on the CMOS circuit.

[Configurations of Other CMOS Circuits]

Figure 7:
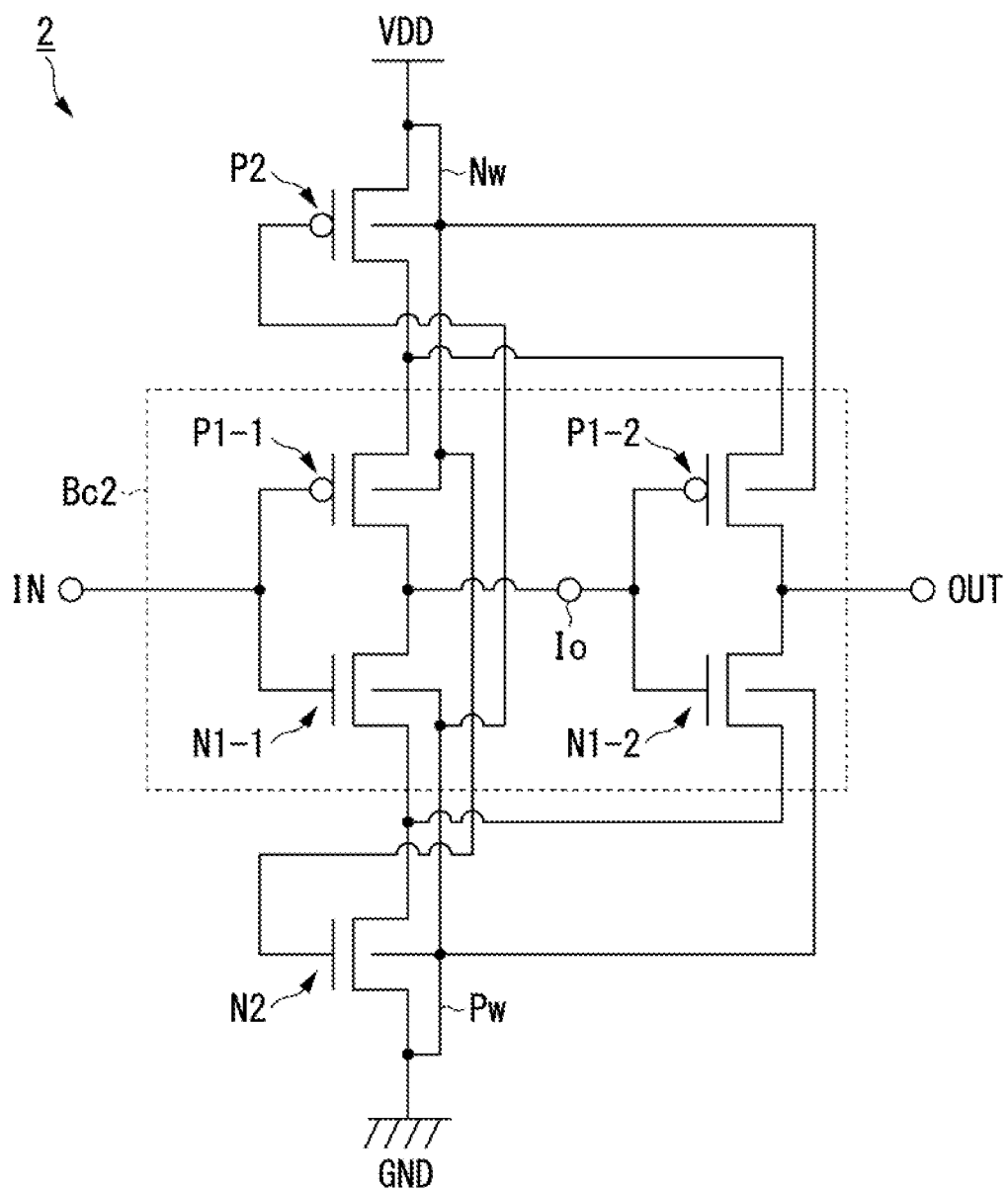
FIG. 7 is a diagram showing another example of the configuration of the CMOS circuit according to the first embodiment.
Figure 8:
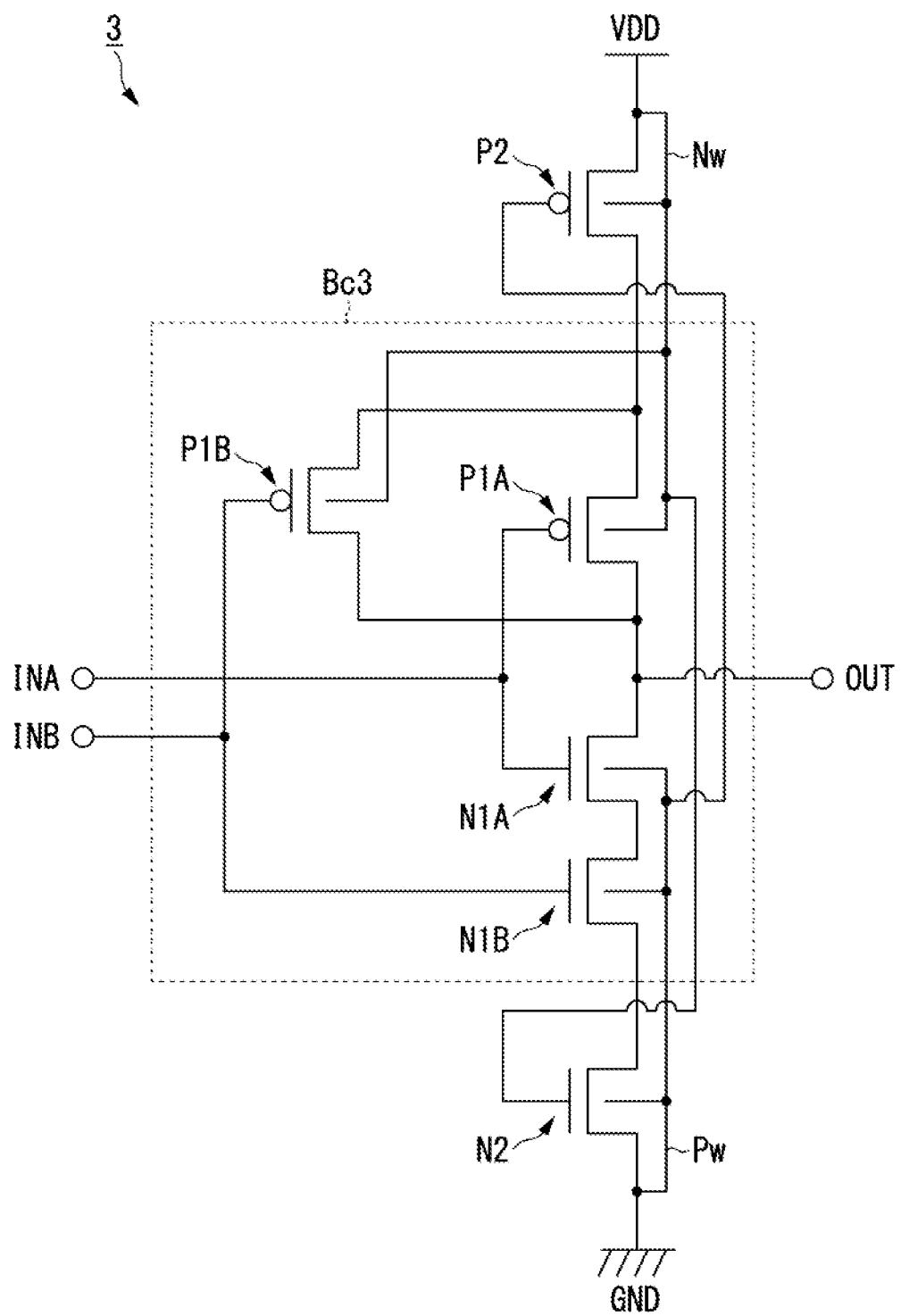
FIG. 8 is a diagram showing yet another example of the configuration of the CMOS circuit according to the first embodiment.
Figure 9:
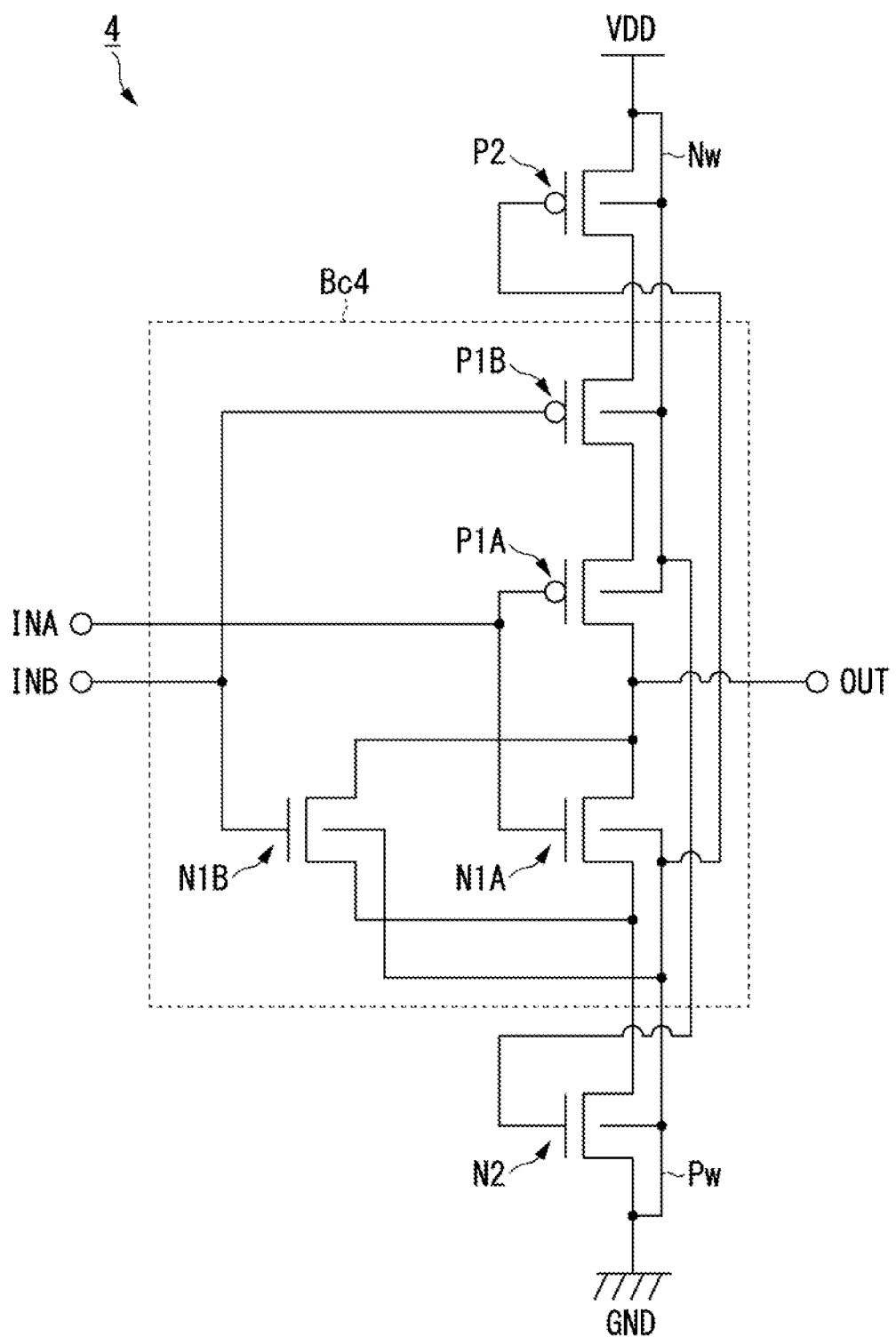
FIG. 9 is a diagram showing yet another example of the configuration of the CMOS circuit according to the first embodiment.

In the above description, the inverter circuit 1 has been described as an example of the CMOS circuit of the first embodiment. However, the CMOS circuit of the first embodiment may have another configuration different from that of the inverter circuit 1. An example of the configuration of a CMOS circuit other than the inverter circuit 1 in the CMOS circuit of the first embodiment will be described below. FIGS. 7 to 9 are diagrams showing another example of the configuration of the CMOS circuit according to the first embodiment.

FIG. 7 shows an example of a buffer circuit in which two NOT circuits are connected in series. The buffer circuit 2 includes a P-channel MOS transistor P1-1, a P-channel MOS transistor P1-2, an N-channel MOS transistor N1-1, an N-channel MOS transistor N1-2, a P-channel MOS transistor P2, and an N-channel MOS transistor N2. The buffer circuit 2 shown in FIG. 7 is an example in which each transistor is formed on a P-type single crystal semiconductor substrate.

In the buffer circuit 2, the configuration of the P-channel MOS transistor P1-1, the P-channel MOS transistor P1-2, the N-channel MOS transistor N1-1, and the N-channel MOS transistor N1-2 is a configuration of a basic buffer circuit (hereinafter referred to as a "basic buffer circuit Bc2") in a general logical operation circuit. In the buffer circuit 2, the P-channel MOS transistor P1-1 and the N-channel MOS transistor N1-1 constitute a first-stage logical negation circuit (an inverter circuit) and the P-channel MOS transistor P1-2 and the N-channel MOS transistor N1-2 constitute a second-stage logical negation circuit (an inverter circuit). In the buffer circuit 2, each of the configurations of the first-stage inverter circuit and the second-stage inverter circuit is similar to the basic NOT circuit Bc1 in the inverter circuit 1.

Also, in the buffer circuit 2, the P-channel MOS transistor P2 is arranged on the source terminal side of the P-channel MOS transistors P1-1 and P1-2 and has a source terminal connected to the power supply VDD and a gate terminal connected to a P-well Pw common to the N-channel MOS transistors N1-1 and N1-2 (a body of the N-channel MOS transistor N1-1 in FIG. 7). The drain terminal of the P-channel MOS transistor P2 is connected to the source terminal of each of the P-channel MOS transistors P1-1 and P1-2. That is, the buffer circuit 2 includes one P-channel MOS transistor P2 shared by the P-channel MOS transistors P1-1 and P1-2. The N-channel MOS transistor N2 is arranged on the source terminal side of the N-channel MOS transistor N1-1 and the N-channel MOS transistor N1-2 and has a source terminal connected to the ground GND and a gate terminal connected to an N-well Nw common to the P-channel MOS transistors P1-1 and P1-2 (a body of the P-channel MOS transistor P1-1 in FIG. 7). The drain terminal of the N-channel MOS transistor N2 is connected to the source terminal of each of the N-channel MOS transistors N1-1 and N1-2. That is, the buffer circuit 2 includes one N-channel MOS transistor N2 shared by the N-channel MOS transistors N1-1 and N1-2. The gate terminals of the P-channel MOS transistor P2 and the N-channel MOS transistor N2 and the well common to the corresponding MOS transistors may be connected through, for example, a well contact or the like.

The P-channel MOS transistors P1-1 and P1-2 are examples of a "plurality of first transistors" in the claims and the N-channel MOS transistors N1-1 and N1-2 are examples of a "plurality of second transistors" in the claims. The basic buffer circuit Bc2 is an example of a "logical operation circuit" in the claims.

Also, in the buffer circuit 2, in the normal operation, an output signal corresponding to an input signal input to the input terminal IN of the buffer circuit 2 is transmitted (output) to the output terminal OUT as in a general buffer circuit. That is, in the buffer circuit 2, the input signal input to the input terminal IN of the buffer circuit 2 is inverted by the first-stage inverter circuit and the inverted input signal is output to the internal node Io. Also, the signal of the internal node Io is further inverted by the second-stage inverter circuit and an output signal having the same logical level as the input signal input to the input terminal IN is transmitted (output) to the output terminal OUT. In the buffer circuit 2, as in the inverter circuit 1, a power-supply circuit composed of the P-channel MOS transistor P2 and the N-channel MOS transistor N2 is also turned off in accordance with the high-energy charged particles E that have been incident and the transmission (output) of a signal including a single event transient occurring in any one transistor in the OFF state provided in the basic buffer circuit Bc2 to the output terminal OUT is eliminated or reduced.

Moreover, the buffer circuit 2 includes one P-channel MOS transistor P2 and one N-channel MOS transistor N2. That is, the buffer circuit 2 includes one power-supply circuit common to both the first-stage inverter circuit and the second-stage inverter circuit. Thereby, the circuit scale of the buffer circuit 2 can be made smaller than when the first-stage inverter circuit and the second-stage inverter circuit include the P-channel MOS transistor P2 and the N-channel MOS transistor N2 corresponding thereto.

FIG. 8 is an example of a two-input NAND circuit. The NAND circuit 3 includes a P-channel MOS transistor PIA, a P-channel MOS transistor P1B, an N-channel MOS transistor NIA, an N-channel MOS transistor NIB, a P-channel MOS transistor P2, and an N-channel MOS transistor N2. The NAND circuit 3 shown in FIG. 8 is an example in which each transistor is formed on a P-type single crystal semiconductor substrate.

In the NAND circuit 3, the configuration of the P-channel MOS transistor PIA, the P-channel MOS transistor P1B, the N-channel MOS transistor NIA, and the N-channel MOS transistor NIB is similar to that of a basic NAND circuit (hereinafter referred to as a "basic NAND circuit Bc3") in a general logical operation circuit.

Also, in the NAND circuit 3, the P-channel MOS transistor P2 is arranged on the source terminal side of the P-channel MOS transistor PIA and the P-channel MOS transistor P1B and has a source terminal connected to the power supply VDD and a gate terminal connected to a P-well common to the N-channel MOS transistor NIA and the N-channel MOS transistor NIB (a body of the N-channel MOS transistor NIA in FIG. 8). The drain terminal of the P-channel MOS transistor P2 is connected to a source terminal of each of the P-channel MOS transistors PIA and P1B. The N-channel MOS transistor N2 is arranged on the source terminal side of the N-channel MOS transistor NIB and has a source terminal connected to the ground GND and a gate terminal connected to the N-well Nw common to the P-channel MOS transistors PIA and P1B (a body of the P-channel MOS transistor PIA in FIG. 8). A drain terminal of the N-channel MOS transistor N2 is connected to a source terminal of the N-channel MOS transistor NIB. That is, the NAND circuit 3 also includes one P-channel MOS transistor P2 shared by the P-channel MOS transistor PIA and the P-channel MOS transistor P1B and one N-channel MOS transistor N2 shared by the N-channel MOS transistor NIA and the N-channel MOS transistor NIB.

The P-channel MOS transistor PIA and the P-channel MOS transistor P1B are examples of a "plurality of first transistors" in the claims and the N-channel MOS transistor NIA and the N-channel MOS transistor NIB are examples of a "plurality of second transistors" in the claims. The basic NAND circuit Bc3 is an example of a "logical operation circuit" in the claims.

Also, in the NAND circuit 3, as in a general NAND circuit, an output signal having a logical level corresponding to the logical levels of input signals input to an input terminal INA and an input terminal INB of the NAND circuit 3 is output to the output terminal OUT in a normal operation. Also, in the NAND circuit 3, as in the inverter circuit 1, a power-supply circuit composed of the P-channel MOS transistor P2 and the N-channel MOS transistor N2 is turned off in accordance with the high-energy charged particles E that have been incident and the output of a signal including a single event transient occurring in any one transistor in the OFF state provided in the basic NAND circuit Bc3 to the output terminal OUT is eliminated or reduced. Moreover, it is possible to reduce a circuit scale by providing one P-channel MOS transistor P2 and one N-channel MOS transistor N2 in the NAND circuit 3.

FIG. 9 is an example of a two-input NOR circuit. The NOR circuit 4 includes a P-channel MOS transistor PIA, a P-channel MOS transistor P1B, an N-channel MOS transistor NIA, an N-channel MOS transistor NIB, a P-channel MOS transistor P2, and an N-channel MOS transistor N2. The NOR circuit 4 shown in FIG. 9 is an example in which each transistor is formed on a P-type single crystal semiconductor substrate.

In the NOR circuit 4, a configuration of the P-channel MOS transistor PIA, the P-channel MOS transistor P1B, the N-channel MOS transistor NIA, and the N-channel MOS transistor NIB is a configuration of a basic NOR circuit (hereinafter referred to as a "basic NOR circuit Bc4") in a general logical operation circuit.

In the NOR circuit 4, the P-channel MOS transistor P2 is arranged on the source terminal side of the P-channel MOS transistor P1B and has a source terminal connected to the power supply VDD and a gate terminal connected to a P-well Pw common to the N-channel MOS transistors NIA and NIB (a body of the N-channel MOS transistor NIA in FIG. 9). A drain terminal of the P-channel MOS transistor P2 is connected to the source terminal of the P-channel MOS transistor P1B. The N-channel MOS transistor N2 is arranged on the source terminal side of the N-channel MOS transistors NA and NIB and has a source terminal connected to the ground GND and a gate terminal connected to an N-well Nw common to the P-channel MOS transistors PIA and P1B (a body of the P-channel MOS transistor PIA in FIG. 9). A drain terminal of the N-channel MOS transistor N2 is connected to source terminals of the N-channel MOS transistors NIA and NIB. That is, the NOR circuit 4 also includes one P-channel MOS transistor P2 shared by the P-channel MOS transistors PIA and P1B and includes one N-channel MOS transistor N2 shared by the N-channel MOS transistors NIA and NIB.

The P-channel MOS transistors PIA and P1B are examples of a "plurality of first transistors" in the claims and the N-channel MOS transistors NIA and NIB are examples of a "plurality of second transistors" in the claims. The basic NOR circuit Bc4 is an example of a "logical operation circuit" in the claims.

Also, in the NOR circuit 4, as in a general NOR circuit, an output signal of a logical level corresponding to logical levels of input signals input to an input terminal INA and an input terminal INB of the NOR circuit 4 is output to the output terminal OUT in the normal operation. In the NOR circuit 4, as in the inverter circuit 1, a power-supply circuit composed of the P-channel MOS transistor P2 and the N-channel MOS transistor N2 is turned off in accordance with the high-energy charged particles E that have been incident and the output of a signal including a single event transient generated in any one transistor in the OFF state provided in the basic NOR circuit Bc4 to the output terminal OUT is eliminated or reduced. Moreover, it is also possible to reduce a circuit scale by providing one P-channel MOS transistor P2 and one N-channel MOS transistor N2 in the NOR circuit 4.

The operation when a single event transient is eliminated or reduced in each of the CMOS circuits shown in FIGS. 7 to 9 can be easily understood on the assumption that it is similar to an operation when high-energy charged particles are incident on the inverter circuit 1 shown in FIGS. 3 to 6.

Accordingly, a detailed description of the operation when the single event transient is eliminated or reduced in each of the CMOS circuits shown in FIGS. 7 to 9 will be omitted. Furthermore, as described above, the CMOS circuit may have various configurations other than those of the CMOS circuits shown in FIGS. 7 to 9. For example, a configuration of a D-type flip-flop circuit obtained by combining a plurality of inverter circuits 1 and transmission gate circuits (so-called transmission gates) is also conceivable. In this case, each CMOS circuit constituting the D-type flip-flop circuit may have a configuration including a P-channel MOS transistor P2 and an N-channel MOS transistor N2 and a configuration including one P-channel MOS transistor P2 and one N-channel MOS transistor N2 shared by all the D-type flip-flop circuits (for example, an equivalent configuration in which a D-type flip-flop circuit is used as the basic NOT circuit Bc1 in the inverter circuit 1). Furthermore, as described above, the CMOS circuit is also conceivable as a memory configuration in which data (a signal level) is stored by combining a plurality of single logical operation circuits, flip-flop circuits, transmission gate circuits, and the like, for example, as in an SRAM or the like. It is only necessary for these configurations to be equivalent to the configurations of the inverter circuit 1 shown in FIG. 1 and the CMOS circuits (the buffer circuit 2, the NAND circuit 3, and the NOR circuit 4) shown in FIGS. 7 to 9. Also, these operations can be easily understood on the assumption that they are similar to operations when the high-energy charged particles are incident on the inverter circuit 1 shown in FIGS. 3 to 6. Accordingly, a detailed description of various configurations and operations conceivable in the CMOS circuits will be omitted.

As described above, in the CMOS circuit of the first embodiment, a configuration of the P-channel MOS transistor P2 whose gate terminal is connected to the P-well Pw of the N-channel MOS transistor N1 and the N-channel MOS transistor N2 whose gate terminal is connected to the N-well Nw of the P-channel MOS transistor P1 is provided as the power-supply circuit for the logical operation circuit having the basic configuration. According to this configuration, in the CMOS circuit of the first embodiment, the output (transmission) of a signal including a single event transient generated in the logical operation circuit in accordance with the incident charged particles E to the output terminal is eliminated or reduced. Thereby, in the CMOS circuit of the first embodiment, it is possible to prevent a single event transient generated inside of the CMOS circuit from propagating to, for example, another CMOS circuit connected to a stage subsequent to the CMOS circuit. Furthermore, in the CMOS circuit of the first embodiment, it is possible to prevent a single event upset in which erroneous data is stored due to propagation of a signal including a single event transient occurring inside of the CMOS circuit. That is, in the CMOS circuit of the first embodiment, it is possible to implement a CMOS circuit with improved resistance to the incidence of charged particles E.

Thereby, even if the semiconductor integrated circuit having the functions implemented by the CMOS circuit of the first embodiment is used in an environment, such as outer space, where high-energy charged particles E are incident, it is possible to reduce the possibility of malfunction. In other words, it is possible to implement a highly reliable semiconductor integrated circuit that is less likely to malfunction due to the influence of the usage environment by implementing the functions in the CMOS circuit of the first embodiment. Thus, even if the semiconductor integrated circuit having the functions implemented by the CMOS circuit of the first embodiment can be used in environments where high reliability is required as well in places other than outer space, for example, such as in industrial equipment, automotive, and medical applications, effects can be obtained.

In the CMOS circuit of the first embodiment, a configuration in which a P-channel MOS transistor P2 whose source terminal is connected to the power supply VDD is arranged on the source terminal side of the P-channel MOS transistor P1 and an N-channel MOS transistor N2 whose source terminal is connected to the ground GND is arranged on the source terminal side of the N-channel MOS transistor N1 is shown. However, the arrangement and connection configuration of the P-channel MOS transistor P2 and the N-channel MOS transistor N2 in the CMOS circuit may be other configurations.

Second Embodiment

A CMOS circuit of a second embodiment will be described below. Even in the following description, for ease of description, a logical negation circuit (an inverter circuit), which is a simplest logical operation circuit, will be described as an example of the CMOS circuit of the second embodiment.

[Configuration of Inverter Circuit]

Figure 10:
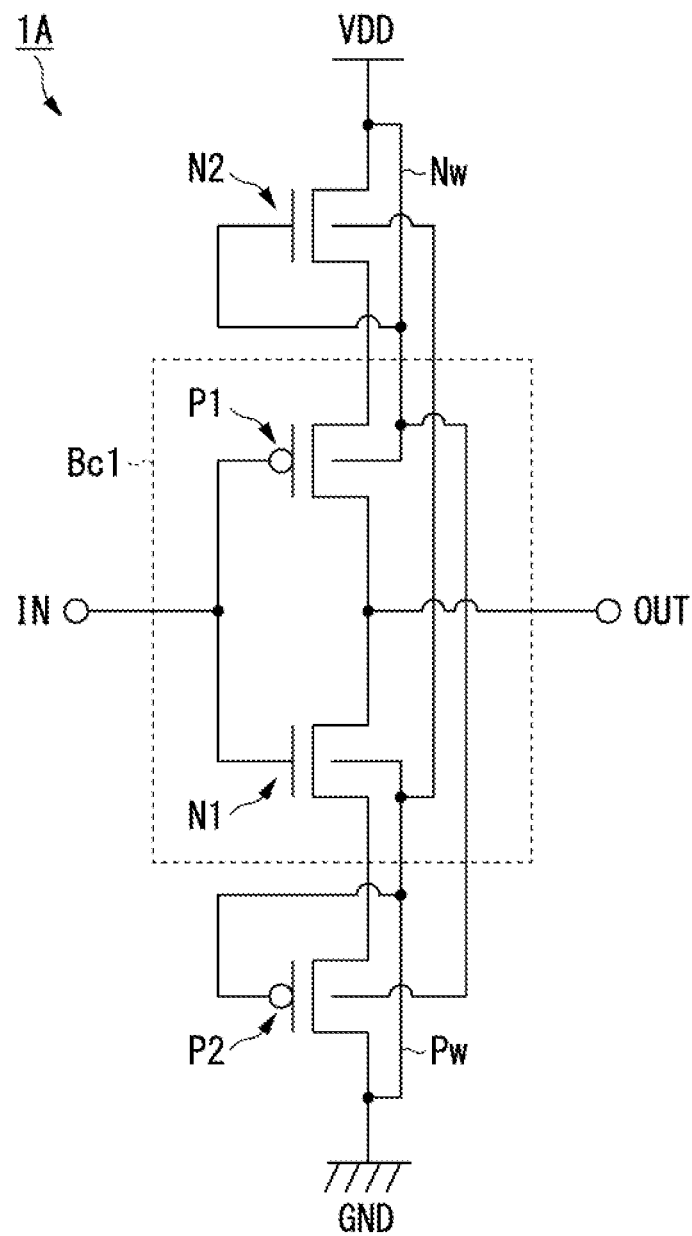
FIG. 10 is a diagram showing an example of a configuration of a CMOS circuit according to a second embodiment.

FIG. 10 is a diagram showing an example of a configuration of the CMOS circuit (the inverter circuit) according to the second embodiment. An inverter circuit 1A includes a P-channel MOS transistor P1, an N-channel MOS transistor N1, a P-channel MOS transistor P2, and an N-channel MOS transistor N2. The inverter circuit 1A shown in FIG. 10 is an example in which each transistor is formed on a P-type single crystal semiconductor substrate.

In the inverter circuit 1A, a configuration of the P-channel MOS transistor P1 and the N-channel MOS transistor N1 is a basic NOT circuit Bc1. In the inverter circuit 1A, the P-channel MOS transistor P2 is arranged on the source terminal side of the N-channel MOS transistor N1 and has a source terminal connected to the ground GND, a gate terminal connected to a P-well Pw of the N-channel MOS transistor N1 (a body of the N-channel MOS transistor N1 in FIG. 10), and a drain terminal connected to the source terminal of the N-channel MOS transistor N1. The N-channel MOS transistor N2 is arranged on the source terminal side of the P-channel MOS transistor P1 has a source terminal connected to the power supply VDD, a gate terminal connected to an N-well Nw of the P-channel MOS transistor P1 (a body of the P-channel MOS transistor P1 in FIG. 10), and a drain terminal connected to the source terminal of the P-channel MOS transistor P1. The gate terminals of the P-channel MOS transistor P2 and the N-channel MOS transistor N2 and wells corresponding thereto may be connected through, for example, well contacts and the like.

Also, in the inverter circuit 1A, the configuration of the P-channel MOS transistor P2 and the N-channel MOS transistor N2 may be a power-supply circuit for the basic NOT circuit Bc1.

Because the N-well Nw is at a VDD level and the P-well Pw is at a GND level as well in the normal operation of the inverter circuit 1A, the power-supply circuit of the inverter circuit 1A is turned on all the time. Thus, in the normal operation of the inverter circuit 1A, an input signal input to the input terminal IN is also inverted at a timing delayed by a prescribed delay time in the basic NOT circuit Bc1 and output to an output terminal OUT.

On the other hand, in the inverter circuit 1A, a single event transient corresponding to the charge of the incident charged particles E also occurs in any one transistor in the OFF state of the inverter circuit 1A when high-energy charged particles E are incident. Thus, in the inverter circuit 1A, the potential level of the N-well Nw also decreases and the potential level of the P-well Pw increases for a reason similar to that as described in the first embodiment. Thereby, in the inverter circuit 1A, the P-channel MOS transistor P2 and the N-channel MOS transistor N2, i.e., the power-supply circuit, are also turned off due to fluctuations in the corresponding well. Thereby, in the inverter circuit 1A, as in the inverter circuit 1 of the first embodiment, the transistor in the OFF state is not affected by the potential levels of the P-well Pw and the N-well Nw that fluctuate according to the charge of the high-energy charged particles E that have been incident and the basic NOT circuit Bc1 eliminates or reduces the output of a signal including a single event transient to the output node (the output terminal OUT).

As described above, in the CMOS circuit of the second embodiment, as in the CMOS circuit of the first embodiment, a configuration of the P-channel MOS transistor P2 having a gate terminal connected to the P-well Pw of the N-channel MOS transistor N1 and the N-channel MOS transistor N2 having a gate terminal connected to the N-well Nw of the P-channel MOS transistor P1 is provided as the power-supply circuit for the logical operation circuit of a basic configuration. According to this configuration, in the CMOS circuit of the second embodiment, as in the CMOS circuit of the first embodiment, the output (transmission) of a signal including a single event transient occurring in the logical operation circuit in accordance with the incident charged particles E to the output terminal is eliminated or reduced. Thereby, the CMOS circuit of the second embodiment can also implement a CMOS circuit with improved resistance to incident charged particles E like the CMOS circuit of the first embodiment.

Moreover, in the CMOS circuit of the second embodiment, transistors connected as a power-supply circuit to transistors constituting the logical operation circuit of the basic configuration are transistors of different conductivity types. More specifically, in the inverter circuit 1A, the transistor connected as a power-supply circuit to the P-channel MOS transistor P1 constituting the basic NOT circuit Bc1 is an N-channel MOS transistor N2 having a different conductivity type and the transistor connected as a power-supply circuit to the N-channel MOS transistor N1 constituting the basic NOT circuit Bc1 is a P-channel MOS transistor P2 having a different conductivity type. Therefore, in the CMOS circuit of the second embodiment, it is possible to increase the resistance to the parasitic bipolar effect that may occur due to a simultaneous operation of adjacent transistors.

Third Embodiment

Figure 11:
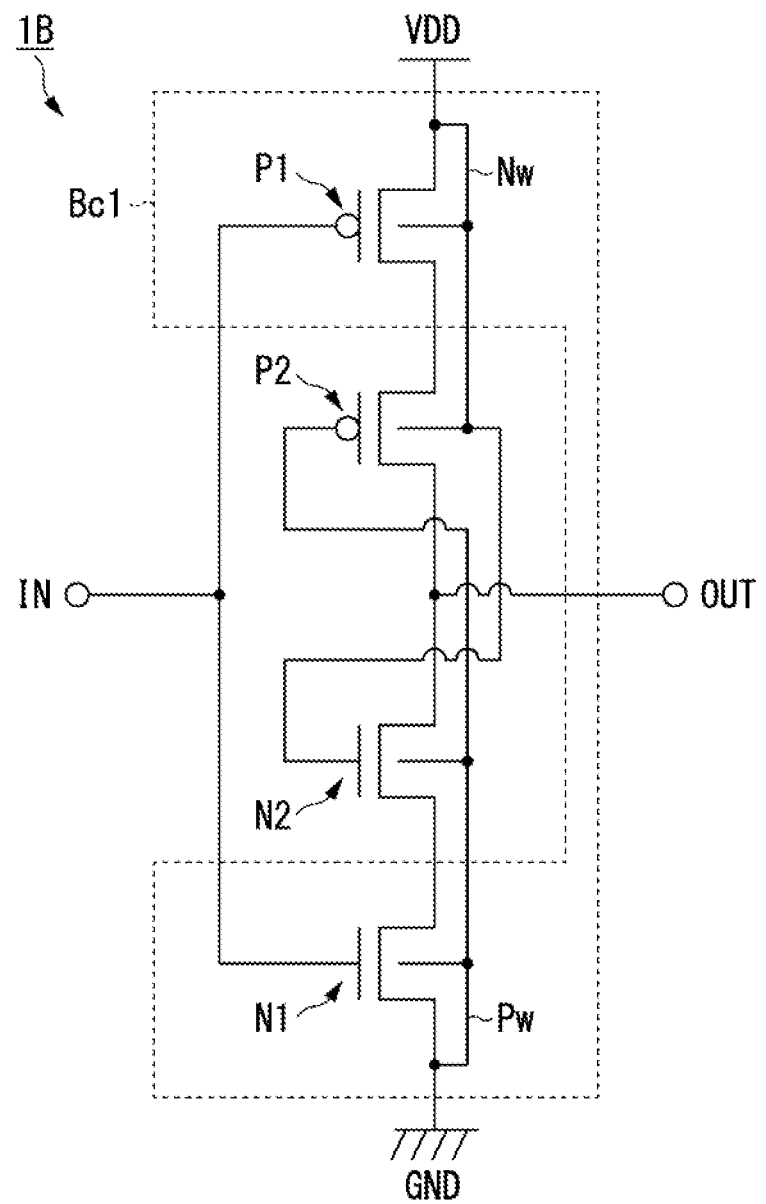
FIG. 11 is a diagram showing an example of a configuration of a CMOS circuit according to a third embodiment.

A CMOS circuit of a third embodiment will be described below. Also in the following description, for ease of description, a logical negation circuit (an inverter circuit), which is the simplest logical operation circuit, will be described as an example of the CMOS circuit of the third embodiment.
[Configuration of Inverter Circuit]
FIG. 11 is a diagram showing an example of the configuration of a CMOS circuit (an inverter circuit) according to the third embodiment. An inverter circuit 1B includes a P-channel MOS transistor P1, an N-channel MOS transistor N1, a P-channel MOS transistor P2, and an N-channel MOS transistor N2. The inverter circuit 1B shown in FIG. 11 is an example in which each transistor is formed on a P-type single crystal semiconductor substrate.

In the inverter circuit 1B, the P-channel MOS transistor P1 has a gate terminal connected to the input terminal IN of the inverter circuit 1, a source terminal connected to the power supply VDD, and a drain terminal connected to the source terminal of the P-channel MOS transistor P2. The N-channel MOS transistor N1 has a gate terminal connected to the input terminal IN of the inverter circuit 1, a source terminal connected to the ground GND, and a drain terminal connected to the source terminal of the N-channel MOS transistor N2.

In the inverter circuit 1B, the P-channel MOS transistor P2 is arranged on the drain terminal side of the P-channel MOS transistor P1 and has a source terminal connected to the drain terminal of the P-channel MOS transistor P1 and a drain terminal connected to the drain terminal of the N-channel MOS transistor N2. The gate terminal of the P-channel MOS transistor P2 is connected to a P-well Pw of the N-channel MOS transistor N1 (a body of the N-channel MOS transistor N1 in FIG. 11). The N-channel MOS transistor N2 is arranged on the drain terminal side of the N-channel MOS transistor N1 and has a source terminal connected to the drain terminal of the N-channel MOS transistor N1 and a drain terminal connected to the drain terminal of the P-channel MOS transistor P2. The gate terminal of the N-channel MOS transistor N2 is connected to an N-well Nw of the P-channel MOS transistor P1 (a body of the P-channel MOS transistor P1 in FIG. 11). The gate terminals of the P-channel MOS transistor P2 and the N-channel MOS transistor N2 and wells corresponding thereto may be connected through, for example, well contacts and the like.

In the inverter circuit 1B, a node to which the drain terminal of the P-channel MOS transistor P2 and the drain terminal of the N-channel MOS transistor N2 are connected serves as the output terminal OUT of the inverter circuit 1B. In the inverter circuit 1B, the configuration of the P-channel MOS transistor P1 and the N-channel MOS transistor N1 is also a basic NOT circuit Bc1. In the inverter circuit 1B, the configuration of the P-channel MOS transistor P2 and the N-channel MOS transistor N2 can be referred to as a transmission circuit of the basic NOT circuit Bc1 rather than a power-supply circuit of the basic NOT circuit Bc1. However, in the inverter circuit 1B, the transmission circuit composed of the P-channel MOS transistor P2 and the N-channel MOS transistor N2 also operates like the power-supply circuit including the P-channel MOS transistor P2 and the N-channel MOS transistor N2 in the inverter circuit 1 of the first embodiment and the inverter circuit 1A of the second embodiment.

That is, because the N-well Nw is at a VDD level and the P-well Pw is at a GND level as well in the normal operation of the inverter circuit 1B, the transmission circuit provided in the inverter circuit 1B is turned on all the time. Therefore, in the normal operation of the inverter circuit 1B, the input signal input to the input terminal IN is also inverted at a timing delayed by a prescribed delay time in the basic NOT circuit Bc1 and the inverted input signal is output to the output terminal OUT.

On the other hand, when high-energy charged particles E are incident as well in the inverter circuit 1B, a single event transient corresponding to the charge of the incident charged particles E occurs in any one transistor in the OFF state provided in the inverter circuit 1B. Thus, as well in the inverter circuit 1B, the potential level of the N-well Nw decreases and the potential level of the P-well Pw increases for a reason similar to that as described in the first embodiment. Thereby, in the inverter circuit 1B, the P-channel MOS transistor P2 and the N-channel MOS transistor N2, i.e., the transmission circuit, are turned off due to fluctuations in the corresponding well. Thereby, in the inverter circuit 1B, as in the inverter circuit 1 of the first embodiment and the inverter circuit 1A of the second embodiment, the transistor in the OFF state is also not affected by the potential levels of the P-well Pw and the N-well Nw that fluctuate due to the charge of the incident charged particles E and the basic NOT circuit Bc1 eliminates or reduces the output of a signal including a single event transient to the output node (the output terminal OUT).

As described above, in the CMOS circuit of the third embodiment, a configuration of the P-channel MOS transistor P2 whose gate terminal is connected to the P-well Pw of the N-channel MOS transistor N1 and the N-channel MOS transistor N2 whose gate terminal is connected to the N-well Nw of the P-channel MOS transistor P1 is provided as the transmission circuit for the logical operation circuit having the basic configuration. According to this configuration, in the CMOS circuit of the third embodiment, as in the CMOS circuit of the first embodiment and the CMOS circuit of the second embodiment, the output (transmission) of the signal including the single event transient occurring in the logical operation circuit in accordance with the incident charged particles E to the output terminal is eliminated or reduced. Thereby, the CMOS circuit of the third embodiment can also implement a CMOS circuit with improved resistance to the incident charged particles E like the CMOS circuit of the first embodiment and the CMOS circuit of the second embodiment.

As described above, according to the CMOS circuit of each embodiment, a configuration of the P-channel MOS transistor P2 whose gate terminal is connected to the P-well Pw of the N-channel MOS transistor N1 and the N-channel MOS transistor N2 whose gate terminal is connected to the N-well Nw of the P-channel MOS transistor P1 is provided in the logical operation circuit having the basic configuration. Thereby, in the CMOS circuit of each embodiment, even if a single event transient occurs in the logical operation circuit due to the incidence of high-energy charged particles of radiation from the usage environment, the output (transmission) of the signal including the generated single event transient to the output node (the output terminal OUT) can be eliminated or reduced. Thereby, even if the semiconductor integrated circuit having the functions implemented by the CMOS circuit of each embodiment is used in an environment where high-energy charged particles are incident, it is possible to reduce a possibility that a malfunction will be performed and obtain high reliability.

In each of the above-described embodiments, an example of the case where the transistors provided in the CMOS circuit are formed on a P-type single crystal semiconductor substrate (bulk substrate) has been described. However, the semiconductor substrate may have various structures such as an N-type single crystal substrate and a P-type or N-type SOI structure substrate in addition to the P-type single crystal substrate. In this case, it is only necessary for the configuration and operation of the CMOS circuit to be equivalent to the configuration and operation of the CMOS circuit formed on the P-type single crystal semiconductor substrate described above. Accordingly, a detailed description of the configuration and operation when the CMOS circuit is formed on a semiconductor substrate different from the P-type single crystal semiconductor substrate will be omitted.

Although modes for carrying out the present invention have been described using embodiments, the present invention is not limited to the embodiments and various modifications and substitutions can also be made without departing from the scope and spirit of the present invention.

REFERENCE SIGNS LIST 1, 1A, 1B Inverter circuit
2 Buffer circuit
3 NAND circuit
4 NOR circuit
P1, P1-1, P1-2, P1A, P1B, P2 P-channel MOS transistor
N1, N1-1, N1-2, N1A, N1B, N2 N-channel MOS transistor
Pw P-well
Nw N-well
Bc1 Basic NOT circuit
Bc2 Basic buffer circuit
Bc3 Basic NAND circuit
Bc4 Basic NOR circuit
Io Internal node

The invention claimed is:

1. A complementary metal oxide semiconductor (CMOS) circuit comprising:
a logical operation circuit formed on a substrate of a first conductivity type and including at least a combination of a first transistor of the first conductivity type having a first well of a second conductivity type different from the first conductivity type and a second transistor of the second conductivity type having a second well of the first conductivity type;
a third transistor of the first conductivity type having a gate terminal connected to the second well; and
a fourth transistor of the second conductivity type having a gate terminal connected to the first well,
wherein the gate terminal of the third transistor is connected to the second well of the second transistor,
wherein the gate terminal of the fourth transistor is connected to the first well of the first transistor,
wherein the third transistor has a source terminal fixed to a power-supply potential and a drain terminal connected to a source terminal of the first transistor, and
wherein the fourth transistor has a source terminal fixed to a ground potential and a drain terminal connected to a source terminal of the second transistor.

2. A complementary metal oxide semiconductor (CMOS) circuit comprising:
a logical operation circuit formed on a substrate of a first conductivity type and including at least a combination of a first transistor of the first conductivity type having a first well of a second conductivity type different from the first conductivity type and a second transistor of the second conductivity type having a second well of the first conductivity type;
a third transistor of the first conductivity type having a gate terminal connected to the second well; and
a fourth transistor of the second conductivity type having a gate terminal connected to the first well,
wherein the gate terminal of the third transistor is connected to the second well of the second transistor,
wherein the gate terminal of the fourth transistor is connected to the first well of the first transistor, wherein the first transistor has a source terminal fixed to a power-supply potential, wherein the third transistor has a source terminal connected to a drain terminal of the first transistor, wherein the second transistor has a source terminal fixed to a ground potential, wherein the fourth transistor has a source terminal connected to a drain terminal of the second transistor, and wherein a drain terminal of the third transistor and a drain terminal of the fourth transistor are connected to an output terminal of the logical operation circuit.

3. A complementary metal oxide semiconductor (CMOS) circuit comprising:

a logical operation circuit formed on a substrate of a first conductivity type and including at least a combination of a first transistor of the first conductivity type having a first well of a second conductivity type different from the first conductivity type and a second transistor of the second conductivity type having a second well of the first conductivity type;

a third transistor of the first conductivity type having a gate terminal connected to the second well; and a fourth transistor of the second conductivity type having a gate terminal connected to the first well, wherein the logical operation circuit is a logical operation circuit including a combination of a plurality of first transistors and a plurality of second transistors, and wherein one third transistor and one fourth transistor are provided.

4. The CMOS circuit according to claim 1, wherein the transistor of the first conductivity type is a P-channel MOS transistor, and wherein the transistor of the second conductivity type is an N-channel MOS transistor.

5. The CMOS circuit according to claim 2, wherein the transistor of the first conductivity type is a P-channel MOS transistor, and wherein the transistor of the second conductivity type is an N-channel MOS transistor.

6. The CMOS circuit according to claim 3, wherein the transistor of the first conductivity type is a P-channel MOS transistor, and wherein the transistor of the second conductivity type is an N-channel MOS transistor.

* * * * *